US006815241B2

(12) United States Patent
Wang

(10) Patent No.: US 6,815,241 B2
(45) Date of Patent: Nov. 9, 2004

(54) GAN STRUCTURES HAVING LOW DISLOCATION DENSITY AND METHODS OF MANUFACTURE

(75) Inventor: Tao Wang, Sheffield (GB)

(73) Assignee: Cao Group, Inc., Sandy, UT (US)

( * ) Notice: Subject to any disclaimer, the term of this patent is extended or adjusted under 35 U.S.C. 154(b) by 127 days.

(21) Appl. No.: 10/255,181

(22) Filed: Sep. 25, 2002

(65) Prior Publication Data

US 2004/0057482 A1 Mar. 25, 2004

(51) Int. Cl.$^7$ ............................................. H01L 21/00
(52) U.S. Cl. ............................. 438/46; 438/22; 438/42; 438/44
(58) Field of Search ................................. 438/22, 42, 44, 438/46, 57, 93, 48, 87

(56) References Cited

U.S. PATENT DOCUMENTS

| | | | |
|---|---|---|---|
| 5,563,422 A | 10/1996 | Nakamura et al. ............. 257/13 |
| 5,578,839 A | 11/1996 | Nakamura et al. ............. 257/96 |
| 5,689,123 A | 11/1997 | Major et al. ................. 257/190 |
| 5,739,554 A | 4/1998 | Edmond et al. ............. 257/103 |
| 5,751,752 A | 5/1998 | Shakuda ....................... 372/45 |
| 5,767,581 A | 6/1998 | Nakamura et al. .......... 257/749 |
| 5,877,558 A | 3/1999 | Nakamura et al. .......... 257/749 |
| 5,880,486 A | 3/1999 | Nakamura et al. ............. 257/96 |
| 5,886,367 A | 3/1999 | Udagawa ....................... 257/64 |
| 5,945,689 A | 8/1999 | Koike et al. ................... 257/88 |
| 5,970,080 A | 10/1999 | Hata ............................. 372/45 |
| 5,981,977 A | 11/1999 | Furukawa et al. ............. 257/94 |
| 5,987,048 A | 11/1999 | Ishikawa et al. .............. 372/46 |
| 6,005,258 A | 12/1999 | Manabe et al. ................ 257/13 |
| 6,017,807 A | 1/2000 | Furukawa et al. .......... 438/502 |
| 6,020,602 A | 2/2000 | Sugawara et al. .......... 257/103 |
| 6,027,992 A | 2/2000 | Gardner et al. ............. 438/588 |
| 6,028,877 A | 2/2000 | Kimura ......................... 372/46 |
| 6,033,490 A | 3/2000 | Kimura et al. ............. 148/33.4 |
| 6,043,140 A | 3/2000 | Kawai et al. ................ 438/503 |
| 6,051,849 A | 4/2000 | Davis et al. ................. 257/103 |
| 6,067,309 A | 5/2000 | Onomura et al. ............. 372/46 |
| 6,067,931 A | 5/2000 | Ghezzo et al. ............... 118/725 |
| 6,069,021 A | 5/2000 | Terashima et al. ............ 438/46 |
| 6,069,439 A | 5/2000 | Matsuda et al. ............. 313/461 |
| 6,069,440 A | 5/2000 | Shimizu et al. ............. 313/486 |
| 6,072,189 A | 6/2000 | Duggan ......................... 257/14 |
| 6,078,063 A | 6/2000 | Nakamura et al. ............ 257/96 |
| 6,078,064 A | 6/2000 | Ming-Jiunn et al. ........ 257/103 |
| 6,086,673 A | 7/2000 | Molnar ......................... 117/90 |
| 6,086,683 A | 7/2000 | Toki et al. ..................... 148/24 |
| 6,091,083 A | 7/2000 | Hata et al. .................... 257/79 |
| 6,093,952 A | 7/2000 | Bandic et al. ............... 257/485 |
| 6,093,965 A | 7/2000 | Nakamura et al. .......... 257/749 |
| 6,100,106 A | 8/2000 | Yamaguchi et al. .......... 438/46 |
| 6,100,546 A | 8/2000 | Major et al. ................. 257/103 |
| 6,110,257 A | 8/2000 | Tom ............................. 438/47 |
| 6,110,809 A | 8/2000 | Sze et al. .................... 438/503 |
| 6,111,275 A | 8/2000 | Hata ............................. 257/97 |
| 6,111,277 A | 8/2000 | Ikeda ........................... 257/99 |
| 6,113,807 A | 9/2000 | Yamaura et al. ...... 252/301.4 R |
| 6,113,965 A | 9/2000 | Goodsall et al. ........ 427/255.39 |
| 6,113,993 A | 9/2000 | Gao et al. .................... 427/573 |
| 6,115,399 A | 9/2000 | Shakuda ....................... 372/45 |
| 6,118,801 A | 9/2000 | Ishikawa et al. .............. 372/46 |
| 6,120,600 A | 9/2000 | Edmond et al. .............. 117/89 |
| 6,121,636 A | 9/2000 | Morita et al. ................. 257/99 |
| 6,121,637 A | 9/2000 | Isokawa et al. ............... 257/99 |
| 2003/0045017 A1 * | 3/2003 | Hiramatsu et al. ............ 438/46 |

* cited by examiner

Primary Examiner—Richard Elms
Assistant Examiner—Brad Smith
(74) Attorney, Agent, or Firm—Daniel P. McCarthy; Parsons Behle & Latimer

(57) ABSTRACT

Included in the invention are laminates having layers of group III–V materials having low dislocation densities, semiconductor devices fabricated using low dislocation density group III–V layers, and methods for making these structures. Some of the inventions are concerned with GaN layers, GaN semiconductor devices, and semiconductor lasers fabricated from GaN materials. Detailed information on various example embodiments of the inventions are provided in the Detailed Description below, and the inventions are defined by the appended claims.

16 Claims, 6 Drawing Sheets

GAN STRUCTURES HAVING LOW DISLOCATION DENSITY AND METHODS OF MANUFACTURE

BACKGROUND OF THE INVENTIONS

The inventions disclosed herein relate to various GaN semiconductor devices, including those with a selective etching low-temperature buffer, and related methods for growing single crystal III–V compound semiconductor layers, including those where such layers include nitrides.

For a number of years high quality GaN semiconductor and related semiconductor layers have been sought for the production of semiconductor devices for optical and electronic devices. Recently the need for these layers has been amplified in light emitting devices, such as light emitting diodes (LEDs) and laser diodes (LDs). These devices have applications in displays, optical storage, and others. GaN and its related semiconductors have been used to produce UV, blue, green, red LEDs and UV and near UV lasers. The LEDs using GaN materials have been widely used in large indoor/outdoor displays, traffic signals, local lighting and others. Lasers using GaN materials tend to have life spans on the order of hundreds of hours. It is desirable that such devices have a lifespan of about 10,000 or more hours to be practicable in consumer electronics. The short lifetime in GaN lasers is due to the increased defects in the initial GaN layer which results in defects being transported to light emitting layers.

A usual GaN device structure consists of multiple layers of different type of materials and is built using epitaxial methods. Each layer requires near perfect crystal structure. Since there is no lattice matched substrate materials available for GaN material, GaN materials has to be grown in lattice mismatch substrate such as sapphire, SiC and etc. Thus, initial GaN layer grown has high defect density caused by lattice mismatch. The defects generated in initial GaN growth will propagate into sequential layers resulting in high defect density in critical layers for devices. The defects in critical layers of the device are detrimental to lifetime. Thus there is a need for initial GaN layer in mismatched substrate having low densities of defects being producible through conventional and reasonably inexpensive methods.

RELATED ART

U.S. Pat. No. 5,563,422 and related U.S. Pat. Nos. 5,767,581; 5,877,558 and 6,093,965 describe GaN based semiconductor devices, some of which are light producing. U.S. Pat. No. 5,578,839 and related U.S. Pat. Nos. 5,880,486 and 6,078,063 also describe GaN light-emitting semiconductor devices. U.S. Pat. No. 5,689,123 and related U.S. Pat. No. 5,689,123 describe III-V arsenide-nitride semiconductor devices. U.S. Pat. No. 5,739,554 and related U.S. Pat. No. 6,120,600 describe light emitting diodes having a GaN active layer. U.S. Pat. No. 5,751,752 and related U.S. Pat. No. 6,115,399 light emitting semiconductor devices using GaN based compounds. U.S. Pat. No. 5,886,367 describes a epitaxial wafer and a light emitting devices using the same. U.S. Pat. No. 5,987,048 and related U.S. Pat. No. 6,118,801 describe GaN based semiconductor lasers. U.S. Pat. No. 5,945,689 describes light emitting devices using group III nitride compounds. U.S. Pat. No. 5,970,080 describes GaN light emitting elements and methods of manufacture. U.S. Pat. No. 5,981,977 describes nitride compound semiconductor light emitters and methods of manufacture. U.S. Pat. No. 6,005,258 also describes GaN based light emitting semiconductor devices. U.S. Pat. No. 6,017,807 describes P-type GaN semiconductor devices and methods of manufacture. U.S. Pat. No. 6,020,602 also describes GaN based light emitting devices and methods of manufacture. U.S. Pat. No. 6,027,992 describes GaN semiconductor devices and methods of manufacture. U.S. Pat. No. 6,028,887 describes a GaN semiconductor laser having an AlGaN cladding layer. U.S. Pat. No. 6,033,490 describes methods of growing GaN layers on quartz substrates. U.S. Pat. No. 6,043,140 describes methods of manufacturing nitride compound semiconductor including GaN. U.S. Pat. No. 6,051,849 discloses structures having an underlying gallium nitride layer, a patterned layer, and a vertical and lateral gallium nitride layer having a low disclocation density. U.S. Pat. No. 6,067,309 also describes a GaN light-emitting semiconductor device. U.S. Pat. No. 6,069,021 describes semiconductor devices including group III nitride crystal layers and methods of manufacture. U.S. Pat. No. 6,069,440 describes a nitride compound light emitting device having a garnet fluorescent phosphor. U.S. Pat. No. 6,072,189 describes group III light-emitting diodes and laser diodes on a sapphire substrate. U.S. Pat. No. 6,078,064 describes an InGaN light emitting diode. U.S. Pat. No. 6,091,083 describes a GaN semiconductor light emitting device having a non-flat buffer layer. U.S. Pat. No. 6,093,952 describes a high-power GaN schottky rectifier. U.S. Pat. No. 6,100,106 describes processes of the manufacture of nitride based semiconductor light emitting devices. U.S. Pat. No. 6,110,809 describes the manufacture of wafers with group III metal nitride epitaxial layers. U.S. Pat. No. 6,111,275 describes GaN compound semiconductor light emitting devices and methods of manufacture. U.S. Pat. No. 6,111,277 describes light emitting semiconductor devices having mask layers to prevent threading dislocations from propagating to successive semiconductor layers during manufacture. U.S. Pat. No. 6,113,985 describes the manufacture of group III nitride targets for use in sputtering and similar equipment. U.S. Pat. No. 6,121,636 describes a GaN light emitting diode having a reflective film to prevent the infiltration of light to mounting adhesive. U.S. Pat. No. 6,121,637 describes a packaged light emitting semiconductor device. All of the above U.S. patents in their entirety are hereby incorporated by reference.

BRIEF SUMMARY OF THE INVENTIONS

Included in the invention are laminates having layers of group III-V materials having low dislocation densities, semiconductor devices fabricated using low dislocation density group III-V layers, and methods for making these structures.

OBJECTS OF THE INVENTIONS

In the inventions, it is desired to provide methods for growing one or more group III-V compound semiconductor layers of nitrides having low dislocation densities on a substrate that has a large lattice mismatch compared with GaN and other group III-V compounds. Some of the inventions are concerned with GaN layers, GaN semiconductor devices, and semiconductor lasers fabricated from GaN materials.

Reference will now be made in detail to some embodiments of the inventions, examples of which are illustrated in the accompanying drawings.

DETAILED DESCRIPTION

One first related method of creating GaN semiconductor layers uses a sapphire or SiC substrate and metalorganic chemical vapor deposition (MOCVD). Conventional methods utilize a first annealing step in which the substrate is heated to a high temperature, 1000° C. or higher, in a controlled atmosphere, such as pure H2. Because of the large lattice-mismatch between GaN and the substrate, it is necessary to introduce a very thin buffer layer of GaN or AlN grown at a low temperature, for example 400 to 600° C. for a sapphire substrate since the critical layer thickness to release the lattice mismatch between GaN (or AlN) and sapphire or SiC substrate to generate dislocations at low temperature will be thicker than higher growth temperature. As long as the GaN layer grown is less than a critical thickness, the GaN layer will be relatively free of defects. Next, a successive base layer of undoped GaN is grown at a high temperature, typically over 1000° C., to a specified thickness, for example 2 $\mu$m. Successive layers of doped GaN or other compatible materials may then be deposited on the base layer to form a semiconductor device. In practice this method yields layers of GaN with relatively high densities of dislocations.

Figure 1A:
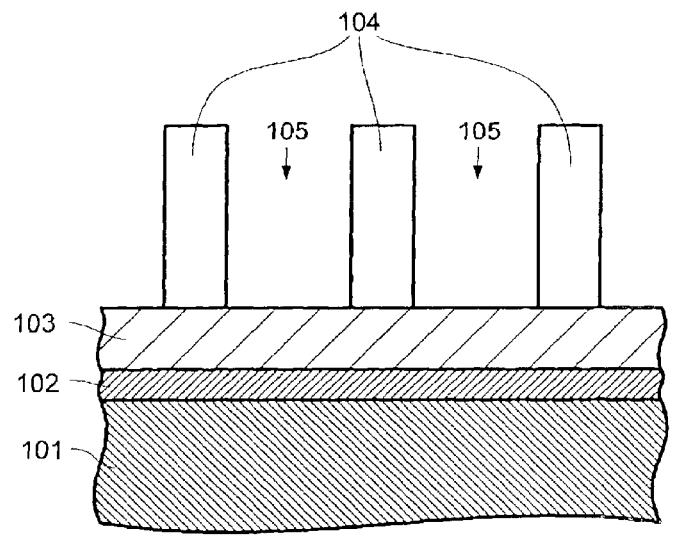
FIGS. 1a-1b depict a method of creating a low dislocation density GaN layer on a substrate.
Figure 1B:
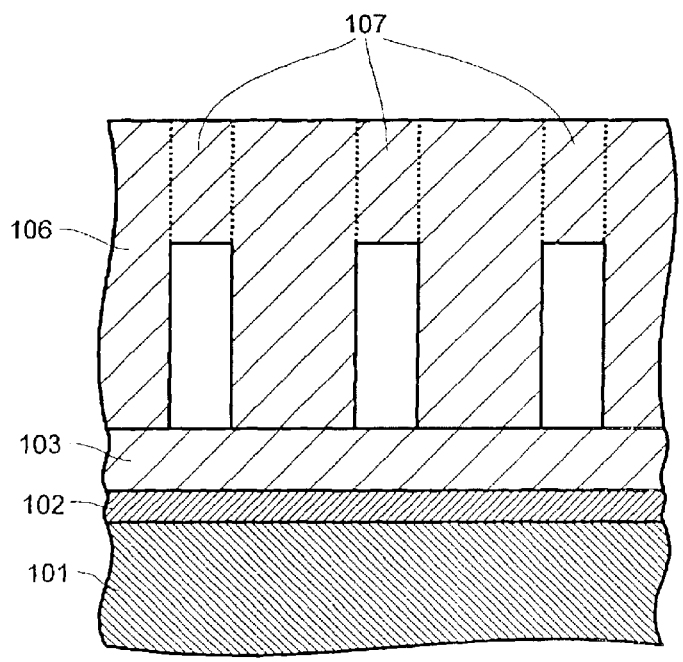

In a second related method, two stages being depicted in FIG. 1, a laminate is produced following the procedure of the first method having a substrate 101, a buffer layer 102, a base layer 103. A series of strips of SiO2, $Si_xN_{1-x}$, or other material is deposited to the base layer in the GaN <1$\bar{1}$00> direction forming a mask layer 104, as shown in FIG. 1a. The width of the strips compared to the separation between the strips 105 is usually made to be 1:2. From the openings between the strips 105, a new high temperature GaN layer 106 is re-grown at a high temperature of more than 1000° C., first vertically and then laterally over the mask strips until the lateral growth fronts coalesce to form a continuous layer, as in FIG. 1b. The material grown laterally over the mask strips is the overgrowth region 107. The growth of the high temperature GaN layer is generally thought to proceed by an islanding and coalescence mechanism. The initial growth of the high temperature GaN layer appears in the form of islands with a truncated hexagonal pyramid shape, the islands coalescing where they meet. After coalescence and further growth the layer eventually becomes flat. The dislocation density of the GaN layer in the overgrowth region will be greatly reduced, and can be used as a new high-quality substrate for producing successive GaN compound layers also having a reduced dislocation density.

Figure 2A:
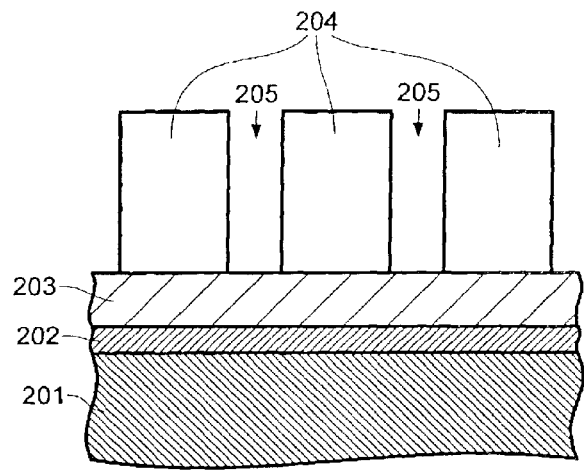
FIGS. 2a-2c depict a method of creating a low dislocation density GaN layer on a substrate.
Figure 2B:
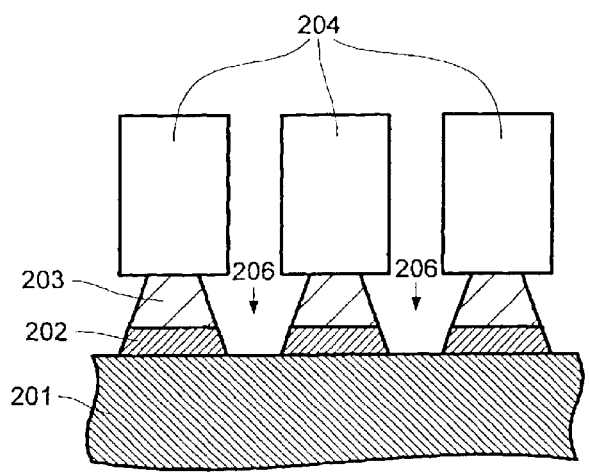
Figure 2C:
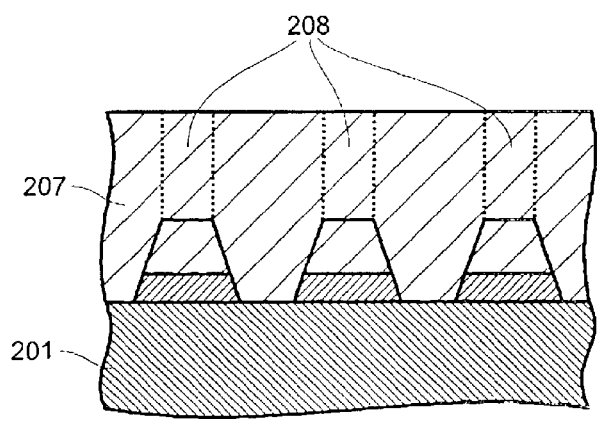

In a third related method, stages of which being shown in FIG. 2, a laminate is produced following the procedure of the first method having a substrate 201, a buffer layer 202, a base layer 203. A patterned mask layer is applied 204 leaving apertures 205, as shown in FIG. 2a. The GaN is then selectively etched down to the substrate through apertures 205 leaving troughs 206, as shown in FIG. 2b. The pattern mask is then removed. The laminate is then introduced into a MOCVD apparatus for growth of a new high temperature GaN layer 207, with overgrowth regions 208 having improved dislocation density, as shown in FIG. 2c.

The reader will note that all of the above methods require the step of depositing a several micrometer GaN layer at high temperature over a buffer layer.

In the invention, it is desired to provide methods for growing one or more high-quality single crystal III–V compound semiconductor layers of nitrides on a substrate that has a large lattice mismatch compared with GaN, such as sapphire, sapphire/quartz, SiC, Si, GaAs, glass, diamond and others, and to provide devices structures that result from implementation of the methods.

FIG. 3 demonstrates steps of a method of the invention by showing a laminate material in cross-section at various stages of the method. The first step of the method is to obtain a substrate 300 such as one of those listed above or another appropriate substrate, as shown in FIG. 3a. Next, a vapor phase deposition technique is used to grow a low temperature buffer layer 302a on substrate 300, as shown in FIG. 3b. MOCVD, sputtering deposition, MBE (molecular beam epitaxy) and HVPE (hydride vapor phase epitaxy) are among suitable techniques for growing a low temperature buffer layer. The temperature for growing a low temperature buffer layer according to the invention will preferably be in the range of from about 200° C. to about 600° C., but may be outside that range in some embodiments of the invention. The material for the low temperature buffer layer may include AlN, GaN, or ZnO and other suitable materials. An example of appropriate thickness for the low temperature buffer layer is about 10–50 nm, although low temperature buffer layers of greater or less thickness may also be constructed according to the inventive concepts.

Figure 3A:
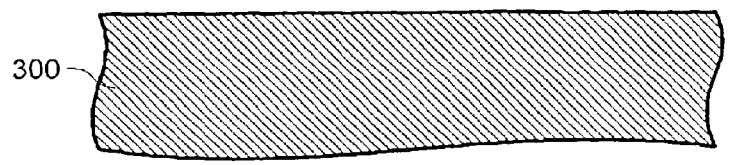
FIGS. 3a-3i depict an improved method of creating a GaN layer having areas of reduced dislocations on a substrate.
Figure 3B:
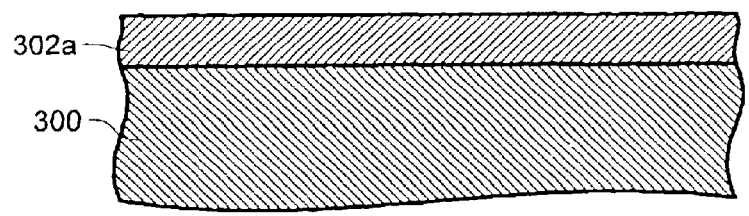
Figure 3C:
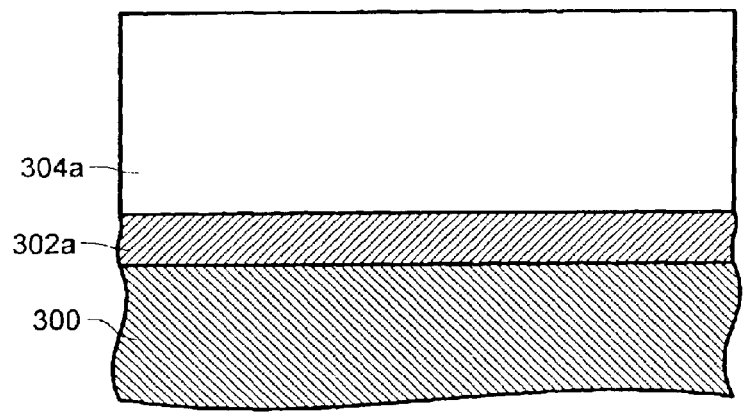
Figure 3D:
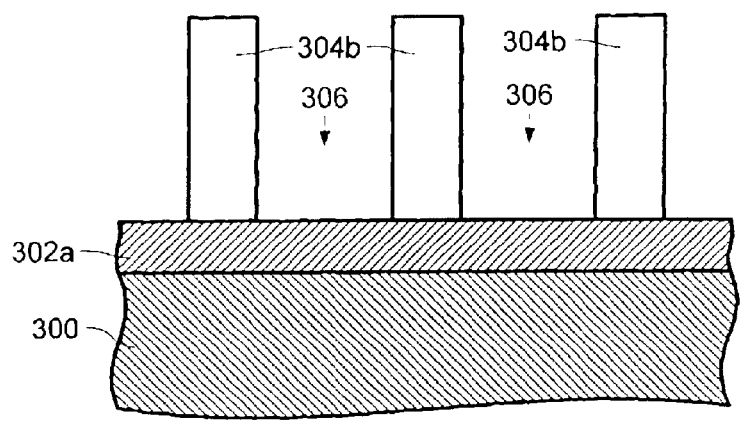

After the growth of the low-temperature buffer, a pattern mask layer 304a is deposited to the laminate, as shown in FIG. 3c. Selected portions of the mask are removed leaving islands of mask 304b with apertures 306 in between. In some methods the islands are strips, intended to produce strips of low temperature buffer material. Apertures 306 should generally run in the GaN <1$\bar{1}$00> direction in order to achieve low dislocation densities. In a specific method of the invention, the mask layer is a photo-sensitive resist layer deposited in liquid form using spin-coat technology, and baked or cured to harden. This layer is typically at least several micrometers thick to provide structural strength. The photo-resist mask is then exposed to light through a photo mask having a predetermined pattern. The non-exposed portions of the photo-resist are then removed.

Figure 3E:
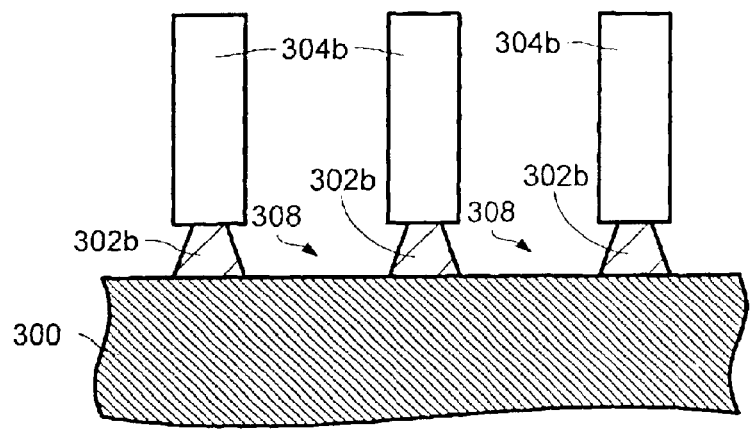
Figure 3F:
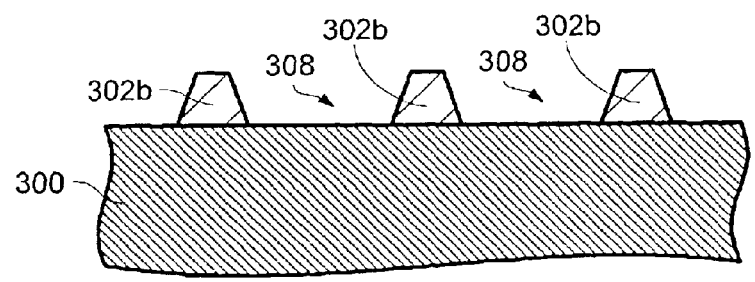

The low-temperature buffer 302a is selectively etched down in the direction of the substrate 300, by which material from the low temperature buffer layer is removed. The result is a number of low temperature buffer material islands 302b separated by troughs 308, as shown in FIG. 3e. One skilled in the art will recognize that these islands may be features of a larger mass of low temperature buffer material, such as peninsulas, so long as they are separated by empty troughs. As shown in the drawing, the walls of the islands 302b may not necessarily be perpendicular to the substrate, but may have a slope which is a side effect of many etchant processes. A dry etching technology such as ICP (intensed coupled plasma) and RIE (reactive ion etching) can be used for the etching step. Following etching the remaining mask 304b is removed in a cleaning step, with the resulting structure of FIG. 3f. In the troughs 308, there is preferably no appreciable low temperature buffer material. The ratio of the width of the low temperature buffer islands to the troughs may be as desired, although it will be seen that a wider trough may produce proportionately more areas of low dislocation density material, but may also require longer successive growth periods.

Figure 3G:
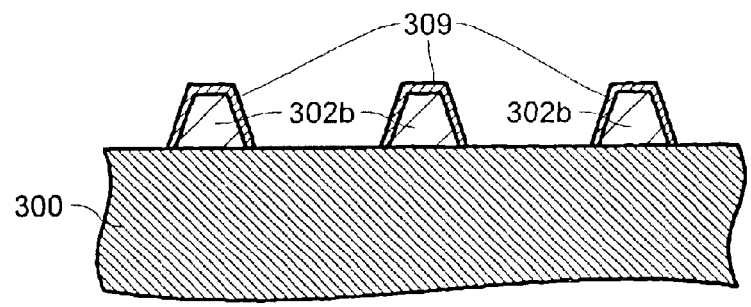
Figure 3H:
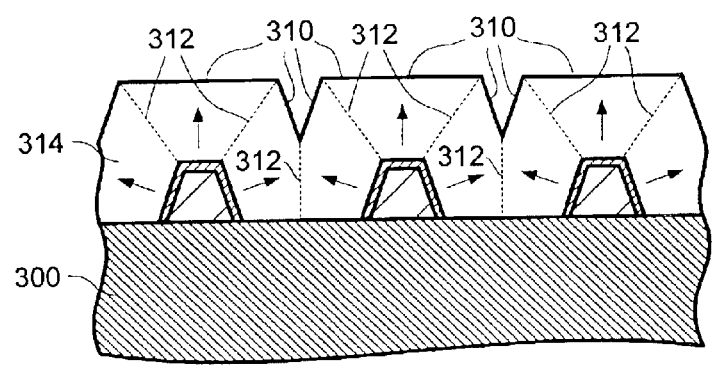
Figure 3I:
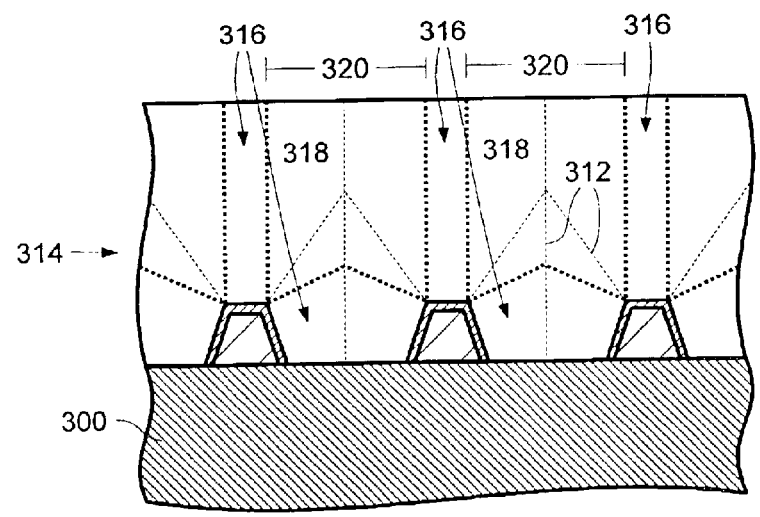

Referring again to FIG. 3f, the substrate 300 with the above-described low temperature buffer islands 302b and intervening troughs 306 is next re-introduced into a vapor deposition growth chamber for re-growth of a vertically grown layer. The substrate temperature is raised to a high temperature, preferably greater than 1000° C. At the beginning of the re-growth process, GaN forms only on the low-temperature buffer strips 302b but not on the substrate 300 in the troughs 306. In one preferred method the aforementioned temperature and V/III ratio (the V/III ratio is from 50000 to 500) is considered optimal for the enhancement of vertical growth. A certain thickness of material 309 is grown, preferably about 0.7 $\mu$m to about 1 $\mu$m, as shown in FIG. 3g. The V/III ratio is changed (10000 to 100) for the enhancement of lateral growth. Referring to FIG. 3h, the growth of material continues generally in the direction of the arrows. So called threading dislocations are continued in that direction of growth, leading to material which is relatively high in dislocations. As the growth of material is continued the lateral growth fronts 310 originating from the low temperature buffer islands coalesce at divisions 312 to form a continuous layer of GaN 314. The growth of the GaN layer is allowed to continue until a desired thickness is achieved in accordance with flatness, structural, thermal, and other requirements. FIG. 3i shows the resulting laminate with divisions 312 where growth fronts have met, regions having high dislocation density 316, and regions of low dislocation density 318. The surface of the resulting GaN layer includes areas 320 with reduced dislocation density on which other III/V structures may be grown inheriting the low dislocation density of the underlying layer.

In practice, the second growth temperature can be ranged from about 800 to about 130° C., V/III ratio can be about 50,000 to about 100, spacing between islands can be ranged from about 10 to about 500 $\mu$m, and the layer thickness can be ranged from about 2 to about 100 $\mu$m.

Figure 4:
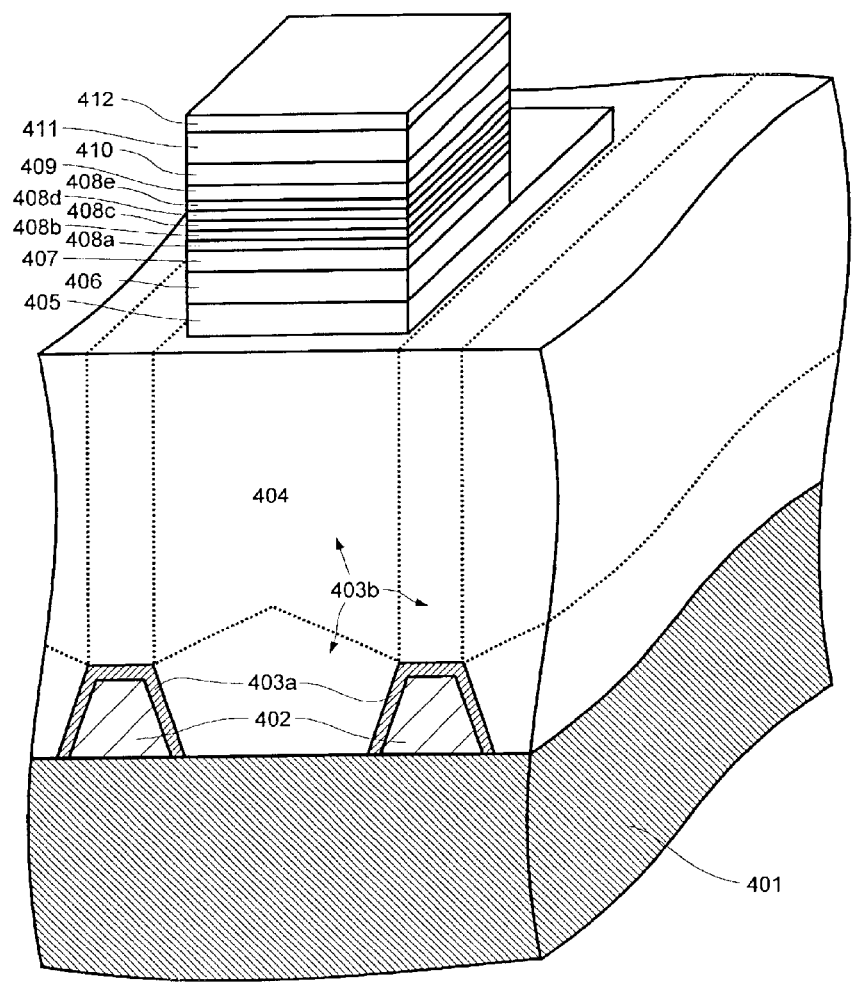
FIG. 4 depicts a semiconductor laser fabricated on a low dislocation area of a GaN layer on a lattice mismatch substrate.

On a laminate structure as described, a semiconductor device with improved characteristics can be manufactured. Using the techniques described above, a longer life laser device can be grown. An example of such a laser is depicted in the perspective view of FIG. 4. A substrate 401 is provided. The substrate 401 may be of any of the previously mentioned substrate materials or another suitable material. Then low temperature buffer strips 402 with intervening troughs are formed as already described. Next, GaN is re-grown on the strips in a new layer 403a, and that new layer eventually coalesces over the troughs to form a continuous and uninterrupted layer 403b. Region 404 provides a low dislocation density substrate for the remaining semiconductor layers.

In one example of a laser, an n-type GaN contact layer 405 from 1 to 5 $\mu$m in thickness is grown followed by a n-type AlGaN/GaN strain-layer supperlattice (SLS) 406 from 0.3 $\mu$m to 1.5 $\mu$m in thickness as a cladding layer. Then a 0.1 to 0.2 $\mu$m n-type GaN as a guiding layer 407 is deposited. Next, 1 to 10 periods of InGaN/GaN multiple-quantum-well structures, shown as five layers 408a–408e, that are 0.01–0.02 $\mu$m in thickness are deposited. These layers 408a–408e are the active layers from which light is produced. Next, a p-AlGaN electron blocking layer 409 is deposited. Then a 0.1 to 0.2 $\mu$m thick p-type GaN layer 410 is formed to serve as a top guiding layer. The top guiding layer 410 is followed by a 0.3 u to 1.5 $\mu$m thick p-type AlGaN/GaN SLS as a top cladding layer 411. Finally, a 0.01 to 0.2 $\mu$m p-GaN contact layer 412 is formed.

Based on such technology, high performance InGaN/GaN-based LED's and lasers, AlGaN/GaN-based UV-LED's and lasers, and GaN-based electron devices can be formed.

Those skilled in the art will recognize that the above method is superior than that disclosed in U.S. Pat. Nos. 6,051,849 and 6,111,277 in that fewer steps are required to produce a high-quality gallium nitride layer. More specifically, the steps of creating a surface wide buffer layer and a gallium nitride underlayment are eliminated from the methods of U.S. Pat. No. 6,051,849. Steps to create additional mask layers, as in the methods of U.S. Pat. No. 6,111,277, are not performed.

While the present devices and methods have been described and illustrated in conjunction with a number of specific configurations, those skilled in the art will appreciate that variations and modifications may be made without departing from the principles herein illustrated, described, and claimed. The present invention, as defined by the appended claims, may be embodied in other specific forms without departing from its spirit or essential characteristics. The configurations described herein are to be considered in all respects as only illustrative, and not restrictive. All changes which come within the meaning and range of equivalency of the claims are to be embraced within their scope.

What is claimed is:

1. A method of making a laminate material having regions of low-dislocation density, comprising:
    depositing a low temperature buffer layer of group III–V material on a substrate;
    depositing a pattern mask on the low temperature buffer layer, said pattern mask having a pattern intended to produce islands of low temperature buffer material separated by troughs;
    removing material from the low temperature buffer layer exposed by the pattern mask forming a formed low temperature buffer layer;
    removing the deposited pattern mask;
    depositing vertically grown high temperature group III–V layers adhering to the formed low temperature buffer layer islands;
    and depositing a continuous high temperature group III–V layer adhering to the vertically grown high temperature layer, the continuous high temperature layer having exposed regions of low dislocation density.

2. A method according to claim 1, further comprising the step of depositing at least one layer of doped group III–V material over at least one exposed region of low dislocation density.

3. A method according claim 1, further comprising the step of depositing a plurality doped layers of group III–V material over at least one exposed region of low dislocation density, the doped layers including at least two contact layers and at least one light producing layer.

4. A method according to claim 1, wherein said depositing a low temperature buffer layer is performed by a vapor phase deposition technique while maintaining the substrate at a temperature from about 200° C. to about 600° C.

5. A method according to claim 1, wherein said depositing vertically grown high temperature group III–V layers is performed by a vapor phase deposition technique while maintaining the substrate at a temperature greater than 1000° C.

6. A method according to claim 1, wherein said depositing a low temperature buffer layer produces a layer of buffer material having a thickness of 10 to 50 nm.

7. A method according to claim 1, wherein said depositing vertically grown high temperature group III–V layers produces layers having a thickness of 0.7 to 1.0 $\mu$m.

8. A method according to claim 1, wherein said depositing a pattern mask is performed to orient the troughs in the <1$\overline{1}$00> direction of the low temperature buffer material.

9. A method according to claim 1, wherein said depositing vertically grown high temperature group III–V layers deposits a ratio of group V compound to a group III compound of 500 to 50,000.

10. A method according to claim 1, wherein said depositing a continuous high temperature group III–V layer deposits a ratio of group V compound to a group III compound of 100 to 50,000.

11. A method according to claim 1, wherein said depositing a continuous high temperature group III–V layer deposits a ratio of group V compound to a group III compound of 500 to 50,000.

12. A method according to claim 1, wherein said depositing a continuous high temperature group III–V layer is performed by a vapor phase deposition technique while maintaining the substrate at a temperature of about 800° C. to about 1300° C.

13. A method according to claim 1, wherein said depositing a low temperature buffer layer produces troughs separating islands of the low temperature buffer layer by about 10 to about 500 μm.

14. A method according to claim 1, wherein said depositing a continuous high temperature group III–V layer deposits a layer having a thickness of about 2 to about 100 μm.

15. A method of making a laminate material having regions of low-dislocation density, comprising:

depositing a low temperature buffer layer of group III–V material on a substrate, said depositing being performed by a vapor phase deposition technique at a temperature from about 200° C. to about 600° C., said depositing forming a low temperature buffer layer having a thickness of about 10 to about 50 nm.;

depositing a pattern mask on the low temperature buffer layer, said pattern mask having a pattern intended to produce islands of low temperature buffer material separated by troughs, the troughs being oriented in the <1$\bar{1}$00> direction of the low temperature buffer material, the troughs separating the islands of low temperature buffer layer material by about 10 to about 500 μm.;

removing material from the low temperature buffer layer exposed by the pattern mask forming a formed low temperature buffer layer;

removing the deposited pattern mask;

depositing vertically grown high temperature group III–V layers adhering to the formed low temperature buffer layer islands, said depositing a vertically grown layer performed by a vapor phase deposition technique while maintaining the substrate at a temperature greater than 1000° C., said depositing a vertically grown layer producing layers having thicknesses of about 0.7 to about 1.0 μm.;

and depositing a continuous high temperature group III–V layer adhering to the vertically grown high temperature layer, the continuous high temperature layer having exposed regions of low dislocation density, said depositing a continuous high temperature group III–V layer is performed by a vapor phase deposition technique while maintaining the substrate at a temperature of about 800° C. to about 1300° C., said depositing a continuous high temperature group III–V layer deposits a layer having a thickness of about 2 to about 100 μm.

16. A product of laminate material having regions of low-dislocation density, the product made by the process of:

depositing a low temperature buffer layer of group III–V material on a substrate, said depositing being performed by a vapor phase deposition technique while maintaining the substrate at a temperature from about 200° C. to about 600° C., said depositing forming a low temperature buffer layer having a thickness of about 10 to about 50 nm.;

depositing a pattern mask on the low temperature buffer layer, said pattern mask having a pattern intended to produce islands of low temperature buffer material separated by troughs, the troughs being oriented in the <1$\bar{1}$00> direction of the low temperature buffer material, the troughs separating the islands of low temperature buffer layer material by about 10 to about 500 μm.;

removing material from the low temperature buffer layer exposed by the pattern mask forming a formed low temperature buffer layer;

removing the deposited pattern mask;

depositing vertically grown high temperature group III–V layers adhering to the formed low temperature buffer layer islands, said depositing a vertically grown layer performed by a vapor phase deposition technique while maintaining the substrate at a temperature greater than 1000° C., said depositing a vertically grown layer producing layers having thicknesses of about 0.7 to about 1.0 μm.;

and depositing a continuous high temperature group III–V layer adhering to the vertically grown high temperature layer, the continuous high temperature layer having exposed regions of low dislocation density, said depositing a continuous high temperature group III–V layer is performed by a vapor phase deposition technique while maintaining the substrate at a temperature of about 800° C. to about 1300° C., said depositing a continuous high temperature group III–V layer deposits a layer having a thickness of about 2 to about 100 μm.

* * * * *